US012765356B2

(12) United States Patent
Choi

(10) Patent No.: US 12,765,356 B2
(45) Date of Patent: Oct. 13, 2026

(54) SEMICONDUCTOR DEVICE INCLUDING POWER RAIL

(71) Applicant: SK hynix Inc., Gyeonggi-do (KR)

(72) Inventor: Woo Sick Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 1057 days.

(21) Appl. No.: 17/153,220

(22) Filed: Jan. 20, 2021

(65) Prior Publication Data

US 2022/0037254 A1 Feb. 3, 2022

(30) Foreign Application Priority Data

Jul. 30, 2020 (KR) ........................ 10-2020-0095436

(51) Int. Cl.
*H10W 20/41* (2026.01)
*H10D 89/10* (2025.01)
*H10W 20/43* (2026.01)
*H10W 42/00* (2026.01)

(52) U.S. Cl.
CPC .......... *H10W 20/427* (2026.01); *H10D 89/10* (2025.01); *H10W 20/43* (2026.01); *H10W 20/435* (2026.01); *H10W 42/00* (2026.01)

(58) Field of Classification Search
CPC ............. H01L 27/0207; H01L 23/5286; H01L 2027/11881; G06F 2119/06
See application file for complete search history.

(56) References Cited

U.S. PATENT DOCUMENTS 9,059,165 B2 * 6/2015 Nagase ............... H01L 23/5286
9,634,026 B1 * 4/2017 Sahu ................ H03K 19/17736
11,675,952 B2 * 6/2023 Peng ..................... G06F 30/398 716/120
2010/0097875 A1 * 4/2010 Vinke ...................... G11C 8/10 438/618
2022/0020691 A1 * 1/2022 You ..................... H10W 20/427
2022/0238442 A1 * 7/2022 Sio ...................... H10W 20/427
2023/0361037 A1 * 11/2023 Kang ............... H01L 29/42392

FOREIGN PATENT DOCUMENTS

KR 10-2016-0099488 8/2016
KR 10-2017-0002398 1/2017

* cited by examiner

*Primary Examiner* — William Henry Anderson
(74) *Attorney, Agent, or Firm* — IP&T GROUP LLP

(57) ABSTRACT

Embodiments of the present disclosure relate to a semiconductor device. According to embodiments of the present disclosure, a semiconductor device may include: a first cell; a second cell; and a power rail that is a passage configured to supply power to the first cell, wherein the power rail may extend in a first direction, and wherein, in the power rail, a width in a second direction, of a portion overlapping the second cell may be greater than a width in the second direction, of a portion overlapping the first cell. This makes it possible to reduce power loss that occurs through the power rail in the semiconductor, and to reduce the possibility of an operation error of cells existing in the semiconductor device.

9 Claims, 7 Drawing Sheets

SEMICONDUCTOR DEVICE INCLUDING POWER RAIL

CROSS REFERENCE TO RELATED APPLICATION

This application claims priority to Korean Patent Application No. 10-2020-0095436, filed on Jul. 30, 2020, which is herein incorporated in its entirety by reference for all purposes as if fully set forth herein.

BACKGROUND

1. Field

Embodiments of the present invention relate generally to a semiconductor device. More particularly, the present invention relates to a semiconductor device with an improved power rail capable of reducing power losses.

2. Description of the Prior Art

Advances in semiconductor process technology have downsized transistors, and have thus enabled a large number of transistors to be integrated in semiconductor devices. This increases difficulty in a process of manufacturing a semiconductor device. In particular, difficulty in designing a power rail, i.e., a passage for transferring power to the memory cells in a semiconductor device, increases.

As the semiconductor process technology further advances, the width of the power rail is also decreasing due to the improved miniaturization of the manufacturing process. However, the resistance of the power rail increases, resulting in an increase in the amount of power loss occurring in the semiconductor device. In order to minimize such power loss, it is necessary to increase the width of the power rail. However, in this case, there is a possibility that the configuration of the semiconductor device violates a preset design rule.

SUMMARY

Various embodiments of the present invention provide a semiconductor device capable of reducing power loss caused by a power rail.

Various embodiments of the present invention provide a semiconductor device capable of reducing the possibility of an operation error of a cell existing therein.

According to an aspect of the present invention a semiconductor device is provided which includes a first cell, a second cell, and a power rail that is a passage for supplying power to the first cell.

The power rail may extend in a first direction.

In the power rail, a width, in a second direction, of a portion overlapping the second cell may be greater than a width, in the second direction, of a portion overlapping the first cell. In this case, the first direction and the second direction may be perpendicular to each other.

For example, the first cell may be a standard cell, and the second cell may be a filler cell or a decoupling capacitor cell. The first cell may include, for example, at least one of a NOR gate, a NAND gate, an XOR gate, and an inverter.

In the power rail, the width, in the second direction, of the portion overlapping the second cell is greater than a set minimum width.

In another aspect, embodiments of the present disclosure may provide a semiconductor device including a first cell, a second cell, and a first power rail and a second power rail, which are passages for supplying power to the first cell.

The first power rail and the second power rail may extend in a first direction.

In the power rail, a width, in a second direction, of a portion overlapping the second cell may be greater than a width, in the second direction, of a portion overlapping the first cell. The first direction and the second direction may be perpendicular to each other.

The first power rail and the second power rail may be respectively located on different layers spaced apart from each other in a third direction perpendicular to the first direction and the second direction.

For example, the first cell may be a standard cell, and the second cell may be a filler cell or a decoupling capacitor cell. The first cell may include, for example, at least one of a NOR gate, a NAND gate, an XOR gate, and an inverter.

In the second power rail, the width, in the second direction, of the portion overlapping the second cell may be greater than a set minimum width.

In an embodiment, the power rail is configured to transfer power to at least one first cell. The power rail may have a line shape extending longitudinally along a first direction. A width of a portion of the power rail in a second direction which is overlapping the at least one second cell may be greater than a width of a portion of the power rail which is overlapping the first cell, in the second direction.

According to embodiments of the present disclosure, it is possible to reduce power loss caused by a power rail in a semiconductor device.

In addition, according to the embodiments of the present disclosure, it is possible to reduce the possibility of an operation error of cells existing in a semiconductor device.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Hereinafter, embodiments of the present disclosure will be described in detail with reference to the accompanying drawings.

Figure 1:
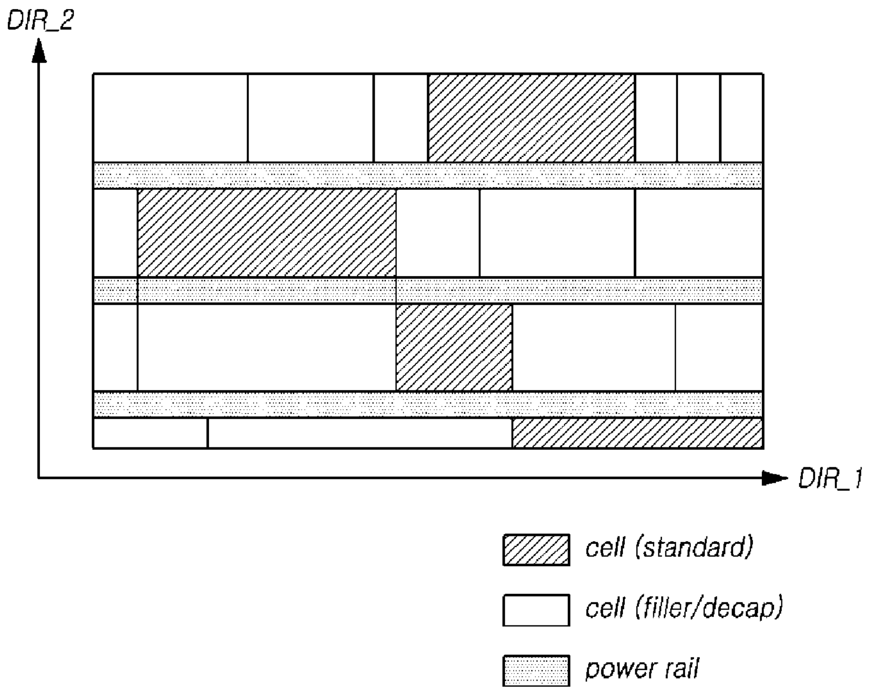
FIG. 1 is a view schematically illustrating a structure of a semiconductor device.

FIG. 1 is a view schematically illustrating a structure of a semiconductor device.

Referring to FIG. 1, a semiconductor device may include one or more power rails.

Each power rail may transfer power to a cell adjacent thereto using power supplied from a power source. The power rail is a passage for transferring power, and a cell included in a semiconductor device may receive power (e.g., Vdd or Vss) through the power rail. In this case, the cells included in the semiconductor device may be a standard cell, a filler cell, or a decoupling capacitor cell. The sizes of respective cells included in the semiconductor device may be different from each other.

The semiconductor device may include one or more cells, and each cell may be electrically connected to one or more power rails or may not be electrically connected to any power rail. A cell electrically connected to a power rail may be electrically connected to the power rail via, for example, one or more conductive lines.

The one or more power rails included in the semiconductor device may extend in a first direction DIR_1. That is, the power rail may be in the form of a rail connected in the first direction DIR_1. The one or more power rails included in the semiconductor device may be disposed to be spaced apart from each other in a second direction DIR_2 perpendicular to the first direction DIR_1.

Figure 2:
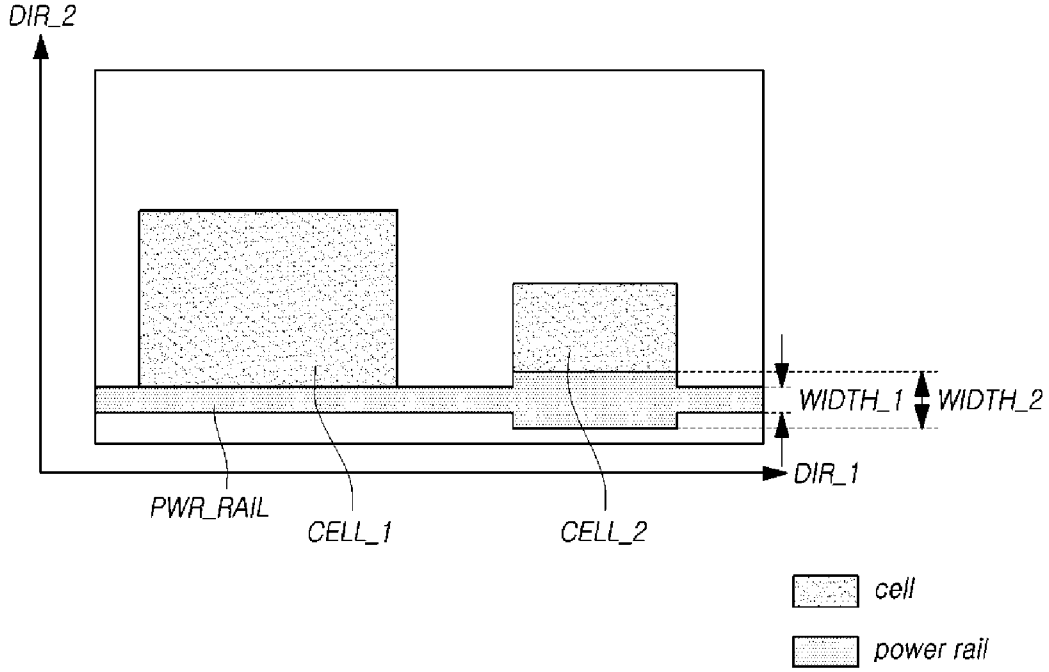
FIG. 2 is a view illustrating an example of a structure of a semiconductor device according to embodiments of the present invention disclosure.

FIG. 2 is a view illustrating an example of a structure of a semiconductor device according to an embodiment of the present disclosure.

Referring to FIG. 2, the semiconductor device may include a first cell CELL_1 and a second cell CELL_2.

The semiconductor device may include a power rail PWR_RAIL, which is a passage for supplying power to the first cell CELL_1. The power rail PWR_RAIL may be electrically connected to the first cell CELL_1 via a conductive line such that power may be supplied to the first cell CELL_1. The power rail PWR_RAIL may have a line shape extending longitudinally along the first direction DIR_1. A width of the power rail PWR_RAIL in the second direction DIR_2 may vary. More specifically, a width of a portion of the power rail POWER_RAIL contacting the first cell CELL_1 may be smaller than a width of the power rail POWER_RAIL overlapping the second cell CELL_2. According to the embodiment illustrated in FIG. 2, the power rail PWR_RAIL has a line shape extending longitudinally along the first direction DIR_1. The width of the power rail POWER_RAIL, i.e., its dimension in the second direction DIR_2 may be uniform except for the portion of the power rail overlapping the second CELL_2 which has a larger width.

As in FIG. 1, the power rail PWR_RAIL may extend in the first direction DIR_1.

As illustrated in the embodiment of FIG. 2, the width of the power rail PWR_RAIL in the second direction DIR_2 may not be uniform, and may vary depending on which cells overlap the power rail in the first direction DIR_1.

In FIG. 2, in the power rail PWR_RAIL, a second width WIDTH_2, which is the width, in the second direction DIR_2, of the portion overlapping the second cell CELL_2, is greater than a first width WIDTH_1, which is the width, in the second direction DIR_2, of the portion overlapping the first cell CELL_1.

As described above, as the width of the power rail (PWR_RAIL) increases, power loss due to the resistance of the power rail (PWR_RAIL) (this power loss is determined by the current I flowing through the power rail and the resistance R of the power rail, and thus may be referred to as IR drop) decreases. Therefore, since the resistance of the power rail PWR_RAIL decreases as the second width WIDTH_2 increases, power loss that may occur due to the power rail PWR_RAIL decreases. This makes it possible for power to be stably supplied to cells receiving the power through the power rail PWR_RAIL, thereby reducing the possibility of an operation error of the cells.

However, in a portion overlapping a specific cell, there may be a case in which it is impossible to expand the width, in the second direction DIR_2, of the portion of the power rail PWR_RAIL overlapping the corresponding cell. This is because when the cell uses the same layer as the layer in which the power rail (PWR_RAIL) is located, it may violate the set design rule.

Accordingly, it is possible to expand the width of the power rail PWR_RAIL when the expansion of the width, in the second direction, of the portion of the power rail PWR_RAIL overlapping one cell DIR_2 does not violate the set design rule. In contrast, it is impossible to expand the width of the power rail PWR_RAIL when the expansion of the width, in the second direction DIR_2, of the portion of the power rail PWR_RAIL overlapping one cell violates the set design rule.

Hereinafter, specific examples of the first cell CELL_1 and the second cell CELL_2 will be described.

Figure 3:
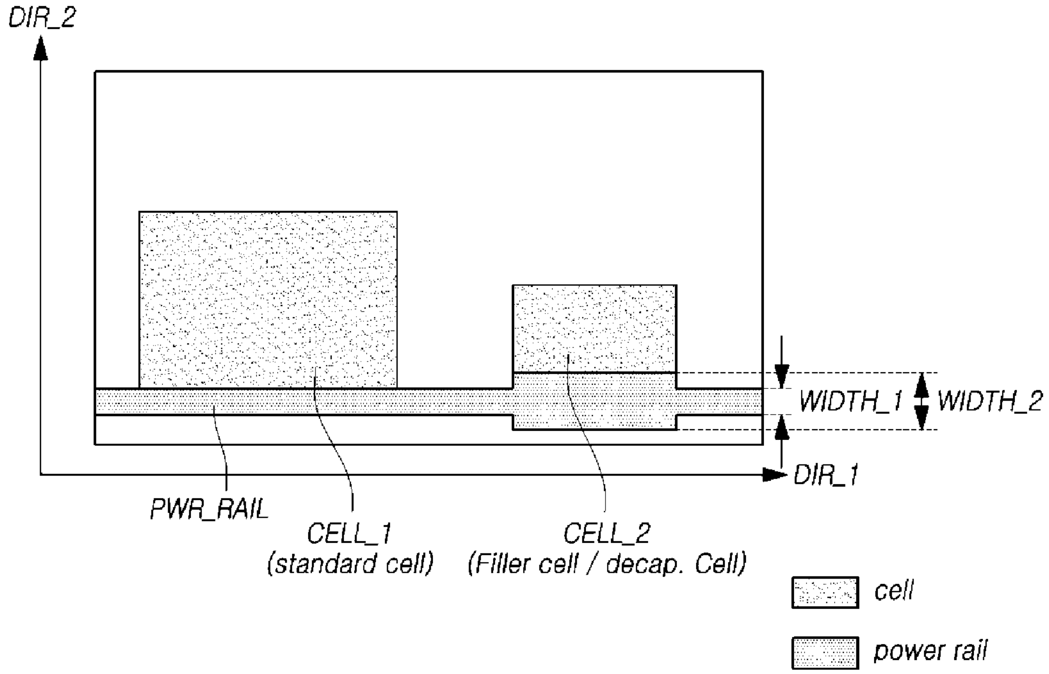
FIG. 3 is a view illustrating information on cells included in the semiconductor illustrated in FIG. 2.

FIG. 3 is a view illustrating information on cells included in the semiconductor illustrated in FIG. 2.

Referring to FIG. 3, the first cell CELL_1 may be a standard cell, and the second cell CELL_2 may be a filler cell or a decoupling capacitor cell.

The standard cell is a cell capable of performing a specific function, and may be implemented as digital logic that performs an arithmetic operation of a semiconductor device. For example, the standard cell may include at least one or more gates for implementing specific logic (e.g. a NOR gate, a NAND gate, an XOR gate, and an inverter).

In contrast, the filler cell or the decoupling capacitor cell is a cell that does not perform a specific function and does not contribute to the arithmetic operation of a semiconductor device. The filler cell or the decoupling capacitor cell is a cell used to fill a space reserved on a semiconductor device (e.g., 30% to 60% of the total space) for minimizing power loss and ensuring spacing between standard cells.

In the embodiments of the present disclosure, the reason why, in the power rail PWR_RAIL, the width of the portion overlapping the second cell CELL_2, that is, the filler cell or the decoupling capacitor cell, is greater than the width of the portion overlapping the first cell CELL_1, that is, the standard cell, is because the standard cell uses the same layer as the power rail PWR_RAIL. That is, because it is impossible to expand the power rail PWR_RAIL to the region already used by the first cell CELL_1, the power rail PWR_RAIL is expandable only in an expandable portion, that is, in the portion overlapping the second cell CELL_2.

Figure 4:
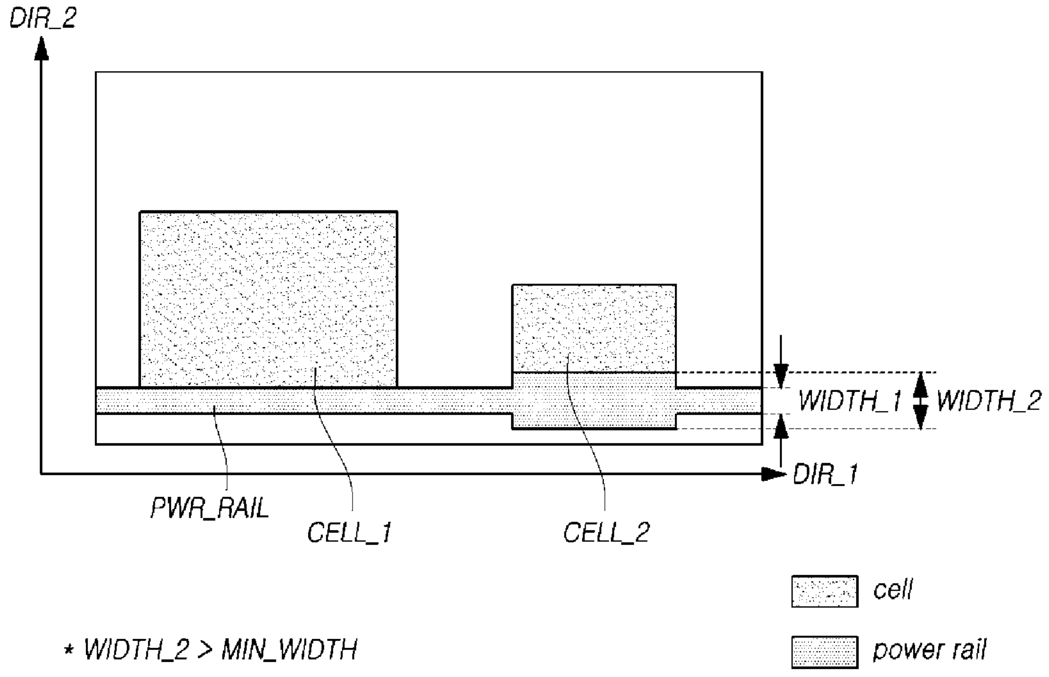
FIG. 4 is a view illustrating a width, in a second direction, of a portion of a power rail adjacent to a second cell in the semiconductor device illustrated in FIG. 2.

FIG. 4 is a view illustrating a width, in the second direction, of a portion of the power rail adjacent to the second cell in the semiconductor device illustrated in FIG. 2.

Referring to FIG. 4, in the power rail PWR_RAIL, the second width WIDTH_2, which is the width, in the second direction DIR_2, of the portion overlapping the second cell CELL_2, may be greater than a set minimum width MIN_WIDTH.

The value of the minimum width MIN_WIDTH may be a value set within a range that does not violate a design rule set according to the design of a semiconductor device.

Figure 5:
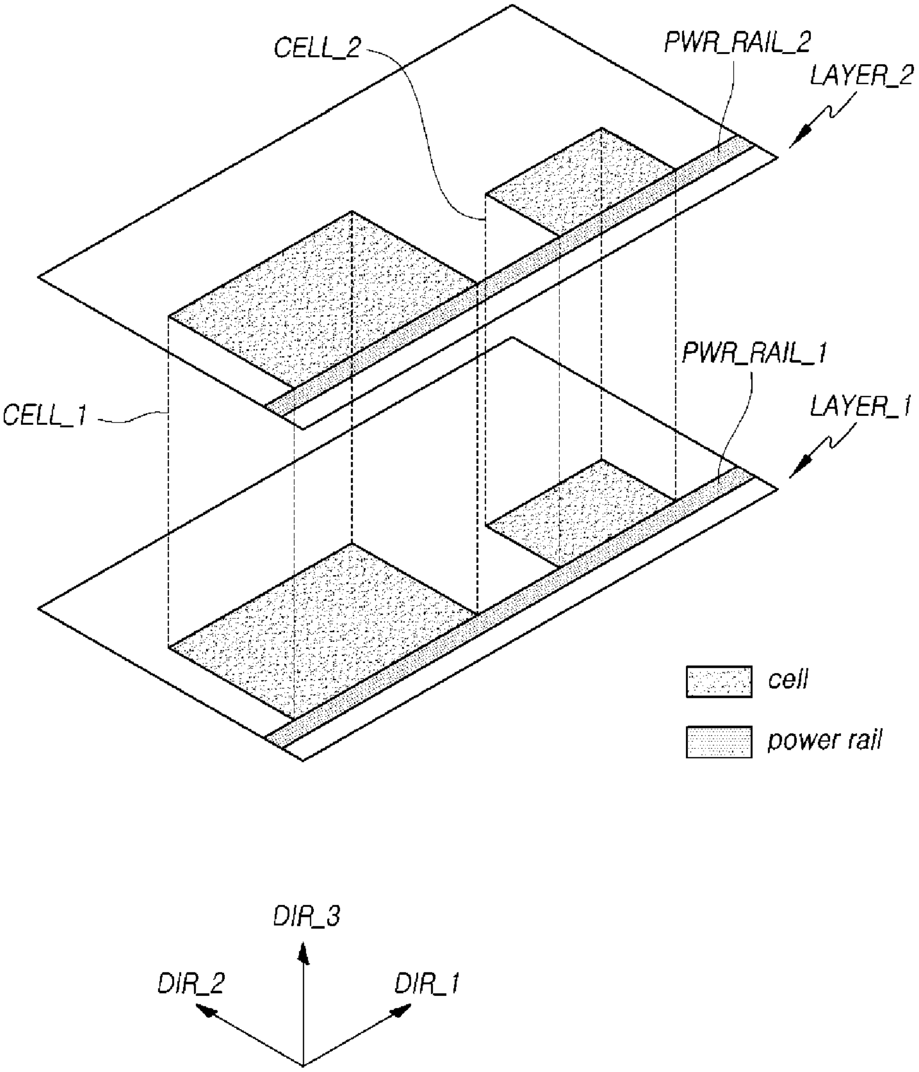
FIG. 5 is a view illustrating another example of a structure of a semiconductor device according to embodiments of the present disclosure.

FIG. 5 is a view illustrating another example of a structure of a semiconductor device according to embodiments of the present disclosure.

Referring to FIG. 5, a semiconductor device may include a first cell CELL_1 and a second cell CELL_2, may include a first power rail PWR_RAIL_1, which is a passage for supplying power to the first cell CELL_1, and may further include a second power rail PWR_RAIL_2.

Whether to use one power rail like the semiconductor device described above with reference to FIG. 2 or two power rails like the semiconductor device described above with reference to FIG. 5 may be determined depending on a process of manufacturing a semiconductor device (e.g., 7 nm/16 nm/28 nm).

In this case, the first power rail PWR_RAIL_1 and the second power rail PWRRAIL_2 may extend in the first direction DIR_1.

Meanwhile, the first power rail PWR_RAIL_1 and the second power rail PWR_RAIL_2 may be located on different layers, respectively. In FIG. 5, the first power rail PWR_RAIL_1 is located on a first layer LAYER_1, and the second power rail PWR_RAIL_2 is located on a second layer LAYER_2.

The first layer LAYER_1 and the second layer LAYER_2 may be spaced apart from each other in a third direction DIR_3 perpendicular to the first direction DIR_1 and a second direction DIR_2 perpendicular to the first direction DIR_1.

Hereinafter, the structure of the semiconductor device of FIG. 5 will be described for each of the first layer LAYER_1 and the second layer LAYER_2.

Figure 6:
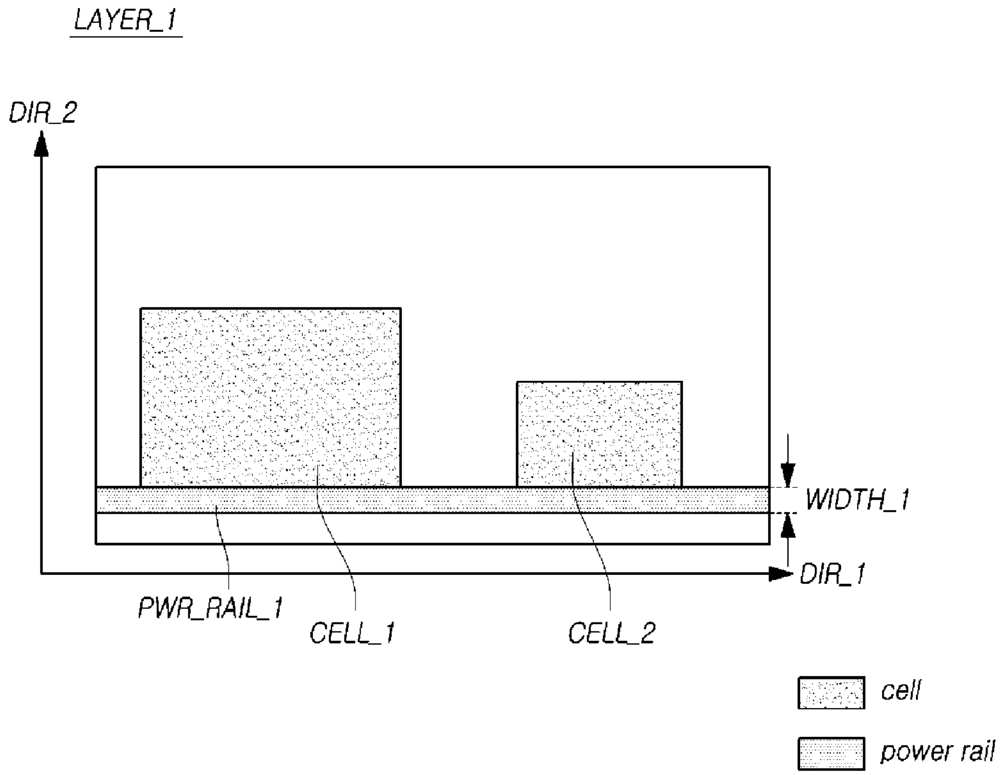
FIG. 6 is a view illustrating a structure of a first layer of the semiconductor illustrated in FIG. 5.

FIG. 6 is a view illustrating the structure of the first layer of the semiconductor illustrated in FIG. 5.

Referring to FIG. 6, the first power rail PWR_RAIL_1 located on the first layer LAYER_1 may overlap the first cell CELL_1 and the second cell CELL_2.

As in FIG. 3, the first cell CELL_1 may be a standard cell, and the second cell CELL_2 may be a filler cell or a decoupling capacitor cell.

The standard cell may include, for example, at least one of a NOR gate, a NAND gate, an XOR gate, and an inverter.

In the first power rail PWR_RAIL_1, the width, in the second direction DIR_2, of the portion overlapping the first cell CELL_1 and the width, in the second direction DIR_2, of the portion overlapping the second cell CELL_2 are uniform and are denoted as a first width WIDTH_1.

Figure 7:
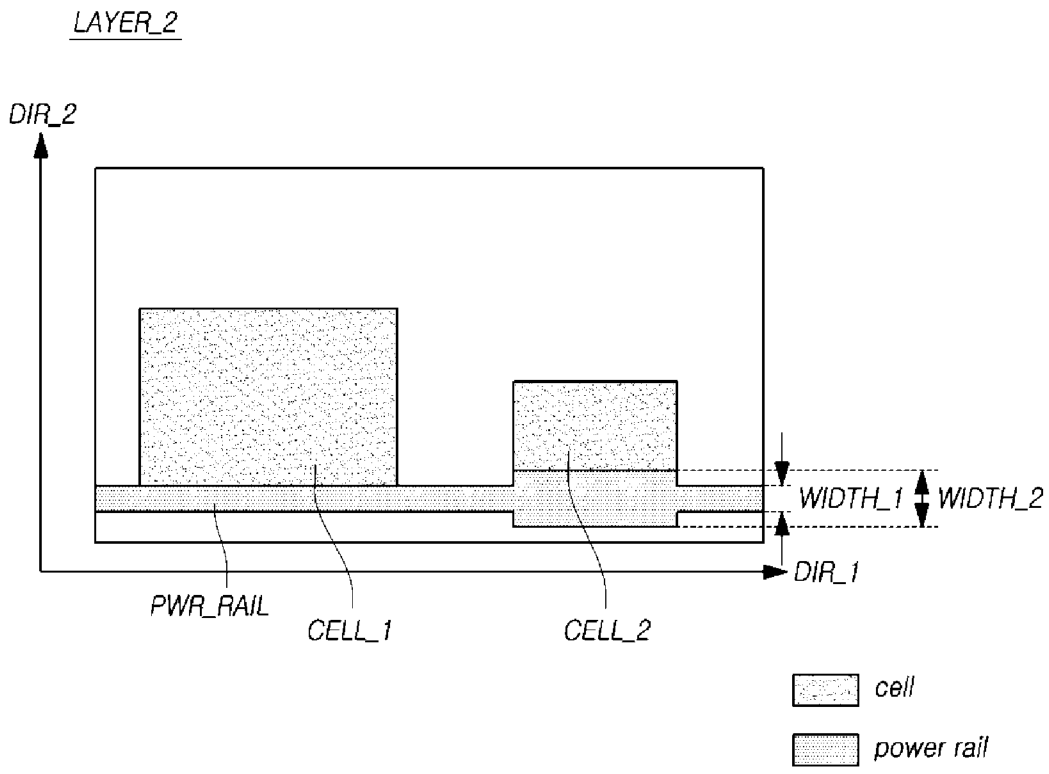
FIG. 7 is a view illustrating a structure of a second layer of the semiconductor illustrated in FIG. 5.

FIG. 7 is a view illustrating the structure of the second layer of the semiconductor illustrated in FIG. 5.

Referring to FIG. 7, the second power rail PWR_RAIL_2 located on the second layer LAYER_2 may overlap the first cell CELL_1 and the second cell CELL_2.

In the second power rail PWR_RAIL_2, a second width WIDTH_2, which is the width, in the second direction DIR_2, of the portion overlapping the second cell CELL_2, is greater than a first width WIDTH_1, which is the width, in the second direction DIR_2, of the portion overlapping the first cell CELL_1.

As described above with reference to FIG. 2, since the resistance of the second power rail PWR_RAIL_2 decreases as the second width WIDTH_2 increases, power loss that may occur due to the second power rail PWR_RAIL_2 decreases. This makes it possible for power to be stably supplied to cells receiving the power through the second power rail PWR_RAIL_2, thereby reducing the possibility of an operation error of the cells.

As described above with reference to FIG. 4, in the second power rail PWR_RAIL_2, the second width WIDTH_2, which is the width, in the second direction DIR_2, of the portion adjacent to the second cell CELL_2, may be greater than a set minimum width MIN_WIDTH.

According to embodiments of the present disclosure described above, the operation delay time of the memory system may be minimized. In addition, according to an embodiment of the present disclosure, an overhead occurring in the process of calling a specific function may be minimized. Although various embodiments of the present disclosure have been described for illustrative purposes, those skilled in the art will appreciate that various modifications, additions and substitutions are possible, without departing from the scope and spirit of the disclosure as disclosed in the accompanying claims. Therefore, embodiments of the present disclosure have been described for the sake of brevity and clarity. The scope of the present disclosure shall be construed on the basis of the accompanying claims in such a manner that all of the technical ideas included within the scope equivalent to the claims belong to the present disclosure.

While the present invention has been described with respect to the various embodiments, it will be apparent to those skilled in the art that various changes and modifications may be made without departing from the spirit and scope of the invention as defined in the following claims.

What is claimed is:

1. A semiconductor device comprising:

a first cell;

a second cell;

a first power rail configured to supply power to the first cell, the first power rail being located on a first layer and the first power rail using the first layer with the first cell; and a second power rail configured to supply power to the first cell, the second power rail being located on a second layer and the second power rail using the second layer with the first cell;

wherein the first power rail and the second power rail extend in a first direction, wherein the first power rail has a first section which is in direct contact with the first cell in the first direction and a second section which, along the first direction, is only in direct contact with the second cell, wherein a width of the second section in a second direction is greater than a width of the first section in the second direction, the second direction being perpendicular to the first direction, wherein the second power rail has a third section which is connected with the first cell in the first direction and a fourth section which is connected with the second cell in the first direction, wherein the first layer and the second layer are spaced apart from each other in a third direction perpendicular to the first direction and the second direction, wherein the first power rail and the second power rail are spaced apart from each other in the third direction, wherein the first cell is a standard cell, and the second cell is a filler cell or a decoupling capacitor cell, wherein the first power rail is expandable only in the second section, and wherein the width of the first power rail is uniform except the second section.

2. The semiconductor device of claim 1, wherein the first cell uses a same layer with the first power rail.

3. The semiconductor device of claim 1, wherein the first cell comprises at least one of a NOR gate, a NAND gate, a XOR gate, and an inverter.

4. The semiconductor device of claim 1, wherein, in the first power rail, the width of the second section is greater than a set minimum width.

5. A semiconductor device comprising:

a first cell;

a second cell;

a first power rail configured to supply power to the first cell, the first power rail being located on a first layer and the first power rail using the first layer with the first cell; and a second power rail configured to supply power to the first cell, the second power rail being located on a second layer and the second power rail using the second layer with the first cell, wherein the first power rail and the second power rail extend in a first direction, wherein the first power rail has a first section which is in direct contact with the first cell in the first direction and a second section which, along the first direction, is only in direct contact with the second cell, wherein a width of the second section in a second direction is greater than a width of the first section in the second direction, the second direction being perpendicular to the first direction, wherein the second power rail has a third section which is connected with the first cell in the first direction and a fourth section which is connected with the second cell in the first direction, wherein a width of the third section in the second direction and a width of the fourth section in the second direction are uniform, wherein the first layer and the second layer are spaced apart from each other in a third direction perpendicular to the first direction and the second direction, and wherein the first power rail and the second power rail are spaced apart from each other in the third direction, wherein the first cell is a standard cell, and the second cell is a filler cell or a decoupling capacitor cell, wherein the first power rail is expandable only in the second section, and wherein the width of the first power rail is uniform except the second section.

6. The semiconductor device of claim 5, wherein the first cell uses a same layer with the first power rail.

7. The semiconductor device of claim 5, wherein the first cell comprises at least one of a NOR gate, a NAND gate, a XOR gate, and an inverter.

8. The semiconductor device of claim 5, wherein, in the first power rail, the width of the second section is greater than a set minimum width.

9. A semiconductor device comprising a first power rail configured to transfer power to at least one first cell, the first power rail having a line shape extending longitudinally along a first direction, the first power rail being located on a first layer and the first power rail using the first layer with the first cell, and a second power rail configured to transfer power to the first cell and a second cell, the second power rail having a line shape extending longitudinally along the first direction, the second power rail being located on a second layer, and the second power rail using the second layer with the first cell, wherein the first power rail has a first section which is in direct contact with the first cell in the first direction and a second section which, along the first direction, is only in direct contact with the second cell, wherein a width of the second section in a second direction is greater than a width of the first section in the second direction, the first direction being perpendicular to the second direction, wherein the second power rail has a third section which is connected with the first cell in the first direction and a fourth section which is connected with the second cell in the first direction, wherein the first power rail and the second power rail are spaced apart from each other in a third direction perpendicular to the first direction and the second direction, and wherein the first cell is a standard cell, and the second cell is a filler cell or a decoupling capacitor cell, wherein the first power rail is expandable only in the second section, and wherein the width of the first power rail is uniform except the second section.

* * * * *